(12) United States Patent
Breunisse

(10) Patent No.: US 7,075,367 B2
(45) Date of Patent: Jul. 11, 2006

(54) INTEGRATED CIRCUIT WITH AN AMPLIFIER

(75) Inventor: Rainier Aart Silvester Breunisse, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 83 days.

(21) Appl. No.: 10/497,050

(22) PCT Filed: Nov. 26, 2002

(86) PCT No.: PCT/IB02/05035

§ 371 (c)(1),
(2), (4) Date: May 28, 2004

(87) PCT Pub. No.: WO03/049284

PCT Pub. Date: Jun. 12, 2003

(65) Prior Publication Data

US 2005/0017806 A1    Jan. 27, 2005

(30) Foreign Application Priority Data

Dec. 3, 2001  (EP) .................................. 01204665

(51) Int. Cl.
*H03F 3/45* (2006.01)
(52) U.S. Cl. ...................................... 330/252
(58) Field of Classification Search ................ 330/252, 330/254, 257
See application file for complete search history.

(56) References Cited

U.S. PATENT DOCUMENTS 4,879,520 A * 11/1989 Cotreau .................. 330/257
5,304,946 A    4/1994 Sano et al. ............... 330/254

* cited by examiner

*Primary Examiner*—Robert Pascal
*Assistant Examiner*—Hieu Nguyen
(74) *Attorney, Agent, or Firm*—Aaron Waxler

(57) ABSTRACT

An amplifier circuit comprises an input transistor Q1 with a first control electrode coupled to the input In and a first main current channel coupled to the internal node 10. An output transistor Q4 has a second control electrode coupled to the internal node 10 and a second main current channel coupled to the output Out of the amplifier. An internal transistor Q2 has a third main current channel coupled to the internal node 10. The internal transistor Q2 serves to modify the impedance at the internal node 10, but a main low-frequency gain path from the first main channel Q1 to the second control electrode does not pass through the third main current channel Q2. The internal node 10 is coupled to ground via the third main current channel Q2 and a resistive element R1 successively. The resistance value of the resistive element R1 causes poles of a transfer function of the amplifier circuit to develop an imaginary frequency (resonant) component.

5 Claims, 4 Drawing Sheets

INTEGRATED CIRCUIT WITH AN AMPLIFIER

A broadband amplifier has to provide a substantially constant gain as a function of frequency up to a cut-off frequency. In transistor amplifiers, leakage of current through the intrinsic capacitances of transistors of the amplifier limits the cut-off frequency. A well-known technique pushing the effect of these leakage currents to higher frequencies is the use of a cascode circuit (also called "common base circuit" or "common gate circuit"), which is a circuit with a transistor whose control electrode is coupled to an essentially constant voltage (not a signal voltage). U.S. Pat. No. 5,304,946 discloses a broadband amplifier with a cascode circuit.

FIG. 1 shows a prior art amplifier circuit with a cascode transistor. An input transistor Q1 receives an input signal at its base. The collector of the input transistor is coupled to the emitter of a first cascode transistor Q2, whose base is coupled to a connection for a constant voltage, i.e. the base is effectively grounded for high frequencies.

In operation, the cascode transistor Q2 serves to shift the cut-off frequency of the circuit to higher frequencies. To appreciate this, one should compare the circuit of FIG. 1 with a circuit in which the cascode transistor Q2 is replaced by a load resistor coupled between the collector of the input transistor Q1 and a positive power supply. In that case, the maximum frequency is determined by the RC time of the input capacitance and the Miller capacitance of the input transistor in parallel with the input resistance. In the circuit of FIG. 1, however, the emitter of the first cascode transistor Q2 forms a much lower impedance than the load resistor, which results in a correspondingly higher cut-off frequency owing to the reduced Miller effect.

U.S. Pat. No. 5,304,946 describes that a trap (dip) may occur in the frequency dependence of such a circuit even below the cut-off frequency. This is a result of the fact that the Miller capacitance (base-collector capacitance) and base-emitter capacitance, through the operation of the cascode circuit, may cause the imaginary part of the effective impedance of the cascode transistor to become positive (as of an inductor). Together with the capacitive output impedance of the input transistor Q1, this may lead to resonance. U.S. Pat. No. 5,304,946 describes how this trap can be suppressed by means of a selected impedance Z between the base of the cascode transistor and the connection for the constant voltage. Inevitably, however, the circuit still has a cut-off frequency.

This can be appreciated by considering the transfer function of the amplifier. The transfer function relates the voltage at the input of the amplifier to the voltage at its output. The transfer function describes the ratio between these two voltages as a function of frequency. Generally, the frequency dependence of the transfer function is described by the ratio $P(f)/Q(f)$ of two polynomial functions $P(f)$, $Q(f)$ of the frequency, "f", a numerator polynomial $P(f)$ divided by a denominator polynomial $Q(f)$. The roots of these polynomials P, Q are generally complex numbers $x+iy$ (so that $P(x+iy)=0$). The roots are characteristic of the frequency of the transfer function, even if the polynomials do not become zero for any real frequency f. The roots of the numerator polynomial P are denoted the zeros of the transfer function and the roots of the denominator polynomial Q are denoted the poles of the transfer function.

The poles and zeros of most circuits with resistors and capacitors but without inductances are on the imaginary frequency axis (i.e. $P(iy)=0$ and $Q(iy)=0$ for some real values of y), which corresponds to damping. The combination of the input resistance and capacitance at input transistor Q1, for example, attributes a pole on the imaginary axis to the transfer function of the amplifier. This pole leads to a decrease in gain with increasing frequency.

It is among the objects of the invention to provide an integrated circuit with an amplifier in which the cut-off frequency is increased further.

The invention provides an amplifier circuit comprising
an input and an output and an internal node;
an input transistor with a first control electrode coupled to the input and a first main current channel coupled to the internal node;
an output transistor with a second control electrode coupled to the internal node and a second main current channel coupled to the output;
an internal transistor with a third main current channel coupled to the internal node, so that a main low-frequency current path from the first main channel to the second control electrode does not pass through the third main current channel;
a resistive element, the internal node being coupled to a power supply connection via the third main current channel and said resistive element in that order, wherein a resistance value of the resistive element exceeds a critical value above which poles of a transfer function of the amplifier circuit develop a real frequency component.

The combination of the resistive element and the internal transistor adds an impedance to ground from the internal node between the input transistor and the output transistor. The voltage produced at this node in response to the current from the input transistor is a determining factor for the transfer function of the circuit. This voltage depends on the impedance provided by the combination of the resistive element and the internal transistor. For low resistance values the dominant poles of the transfer function of the amplifier are imaginary poles and zeros. However, it has been discovered that by simply increasing the resistance value of the resistive element, one can pass a critical value for the impedance of this combination. Raising the resistance value above this critical value shifts the poles of the transfer function into the complex plane, so that these poles have both an imaginary and a real part. This raises the cut-off frequency of the amplifier.

In addition, the increase of the resistance value causes a zero of the transfer function to shift towards the real frequency axis (decreasing imaginary part of the pole). The additional effect of this zero is to compensate for the effect of the pole caused by the circuit at the control electrode of the input transistor. In an embodiment of the amplifier according to the invention, the resistance value is selected such that the zero has a lower frequency position than, or a same frequency position as the pole caused by the circuit at the control electrode of the input transistor. Preferably, the zero substantially coincides with this pole, i.e. differs less than, say, 10% in frequency. This results in an optimum broadband gain.

It should be noted that the internal transistor, although connected in a similar way as a conventional cascode transistor, is not used as a conventional cascode with its main current channel interconnecting the main current channel of the input transistor and the control electrode of the output transistor. The main low-frequency amplification path between the input and output of the amplifier does not run through the main current channel of the internal transistor. The combination of the resistive element and the internal transistor is merely coupled between an internal node in that path and ground so as to affect the impedance at the internal node. Low-frequency current from the main current channel of the input transistor to the control electrode of output transistor does not flow through the main current channel of the internal transistor (although, the changes in the current though the internal transistor are substantially equal to changes in current through the output transistor at low frequencies, but of opposite sign, owing to a current mirror effect).

An embodiment of the circuit comprises a further output transistor with a fourth main current channel in series with the second main current channel and a fourth control electrode coupled to a further node between the third main current channel and the resistive element. In this way an additional current leaks to the resistive element from the output transistor at higher frequencies. As a result the critical resistance value is reached sooner, so that a lower resistance value suffices for a sufficient shift of the poles of the transfer function. Moreover, it has been found that in this way the poles move away from the imaginary frequency axis over a greater angle, resulting in a better broadband characteristic. An optimum broadband characteristic, where the poles are at 45 degrees to the axis at the time when the zero compensates the input pole, can be realized in this way.

It should be noted that in this embodiment the main current channel of the internal transistor is effectively still not included in the amplification path. The low frequency current through the main current channel of the further output transistor is determined by the current through the main current channel of the output transistor, and at low frequencies it is not affected by the coupling between the control electrode of the further output transistor and the resistive element.

In a further embodiment, both branches of a differential amplifier are implemented according to the invention. Thus a broadband differential amplifier is realized.

These and other objects and advantageous aspects of the integrated circuit according to the invention will be described in more detail with reference to the accompanying drawing.

Figure 1:
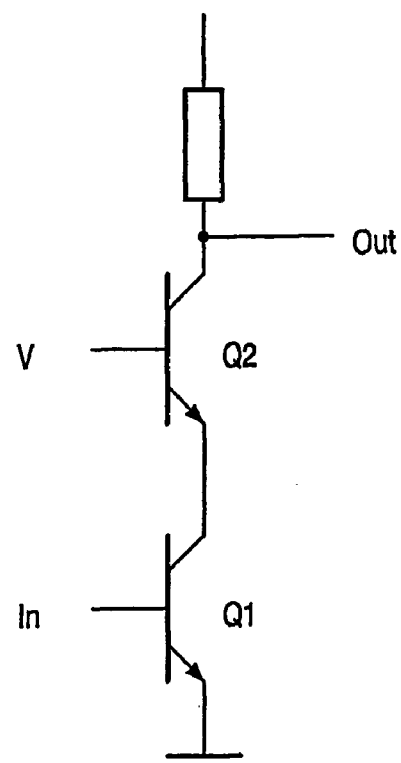
FIG. 1 shows a prior art amplifier circuit.
Figure 2:
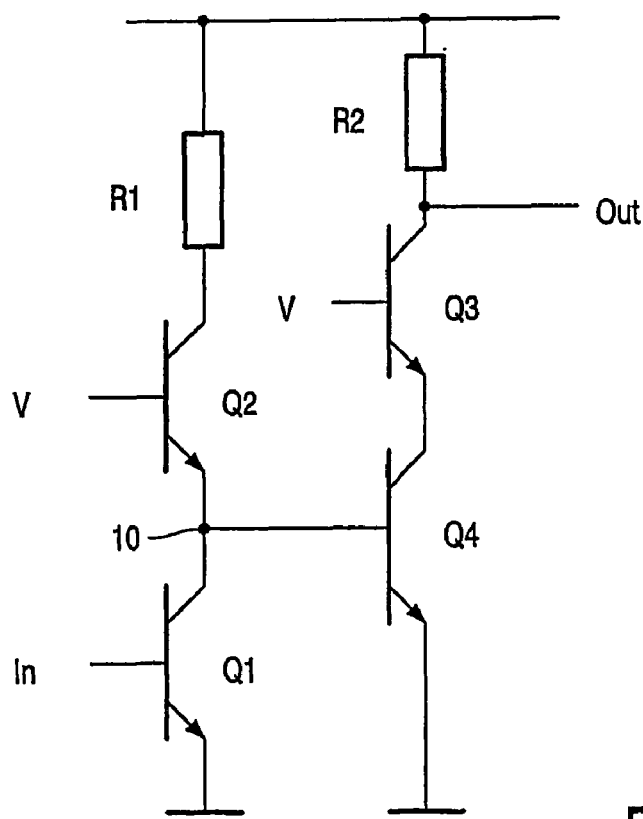
FIG. 2 shows an amplifier circuit according to the invention.
Figure 3A:
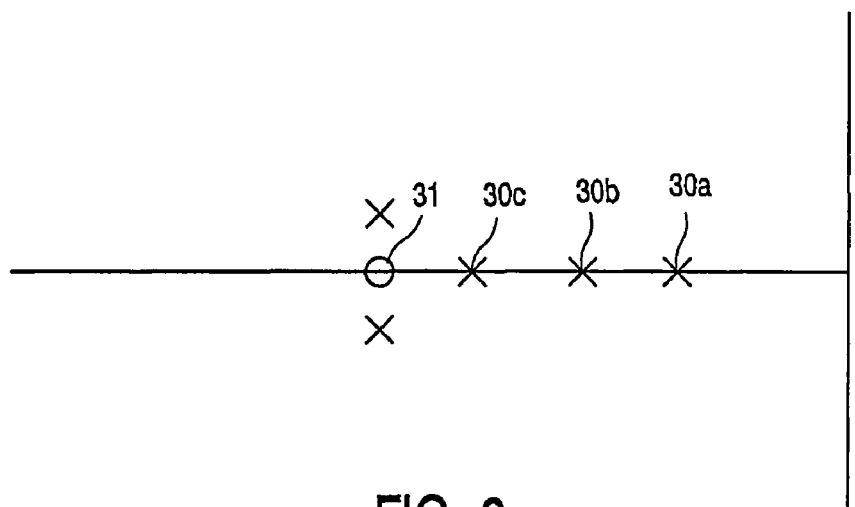
Figure 3B:
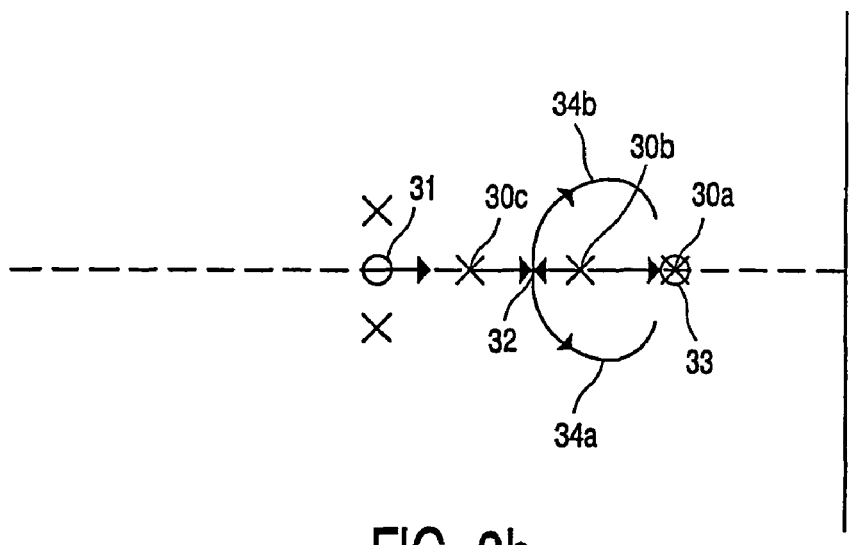
Figure 4:
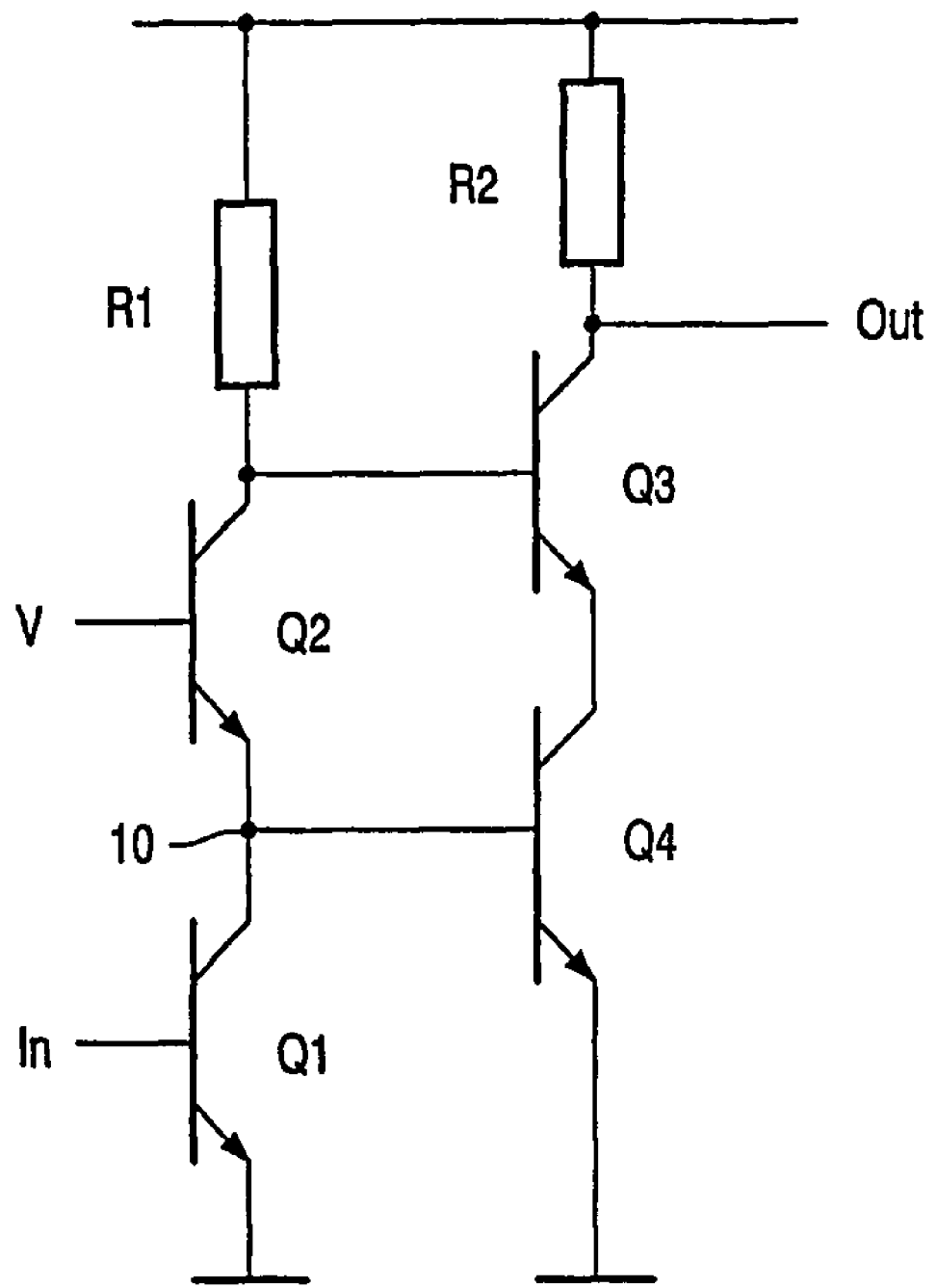

FIGS. 3a–b show pole migration of the circuit of FIG. 2,

FIG. 4 shows a further amplifier circuit according to the invention, and

Figure 5:
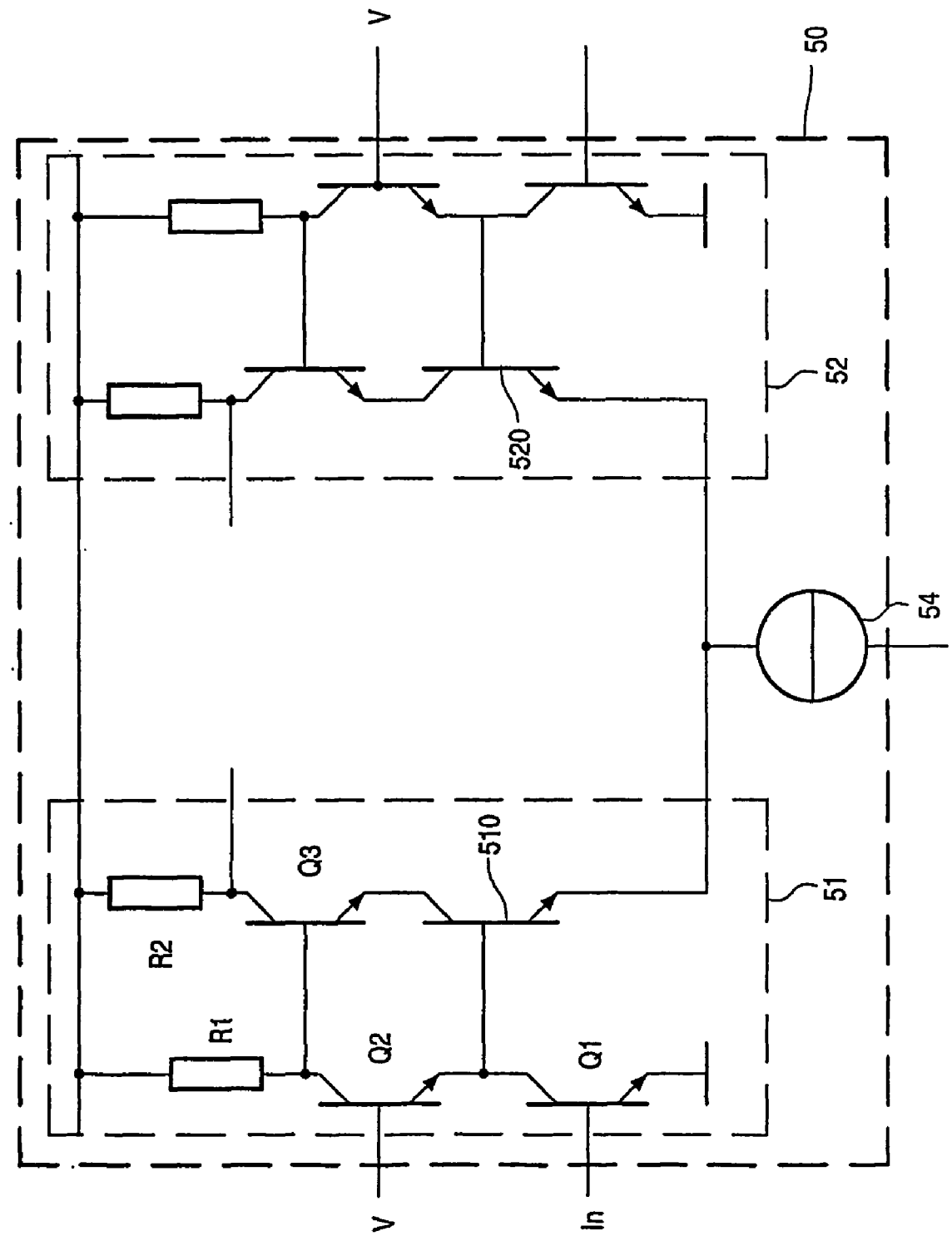

FIG. 5 shows a differential amplifier circuit according to the invention.

FIG. 2 shows an amplifier circuit according to the invention. The circuit comprises an input transistor Q1, an internal transistor Q2, an output transistor Q4, a further output transistor Q3, and a first and second load resistor R1, R2. An input transistor Q1 forms an input of the circuit. Via a node 10 the collector of the input transistor Q1 is coupled to the emitter of internal transistor Q2, whose base is coupled to a connection for a constant voltage, i.e. the base is effectively grounded for high frequencies. The collector of the internal transistor Q2 is coupled to a positive power supply (effective ground for higher frequencies) via first load resistor R1.

The collector of the input transistor Q1 is coupled to the base of the output transistor Q4, whose collector is coupled to the emitter of the further output transistor Q3. The base of the output cascode transistor Q2 is coupled to a connection for a constant voltage, i.e. the base is effectively grounded for high frequencies. The collector of the further output transistor Q3 forms the output of the amplifier circuit and is coupled to the positive power supply through second load resistor R2.

In operation at low frequencies, input transistor Q1 draws a collector current that changes proportionally to changes in the voltage at the base of transistor Q1. Internal transistor Q2 and output transistor Q4 perform a current mirror function, because the base-emitter voltage changes of these transistors are mutually opposed. A change in the current drawn by the collector of input transistor Q1 leads to a corresponding change in the collector current drawn by internal transistor Q2 and to an opposite change in the collector current of output transistor Q4. Further output transistor Q3 passes the change in collector current of output transistor Q4 to second load resistor R2. At low frequencies, first load resistor R1 has little or no effect on the current through second load resistor $R_2$, because the emitter voltage of further output transistor Q3 follows changes in the base voltage of the output cascode transistor.

Figure 2A:
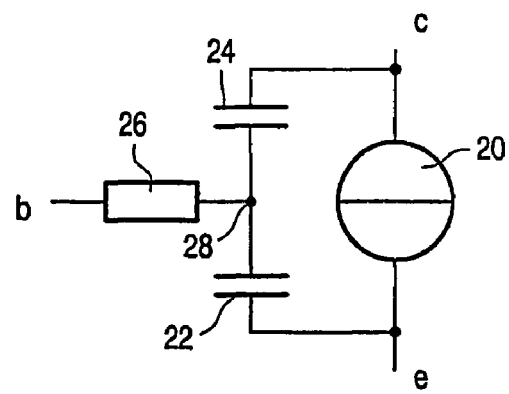
FIG. 2a shows a transistor model.

FIG. 2a shows an equivalent circuit model of a transistor such as Q1, Q2, Q3, or Q4. The model contains a current source 20, between emitter and collector, which provides the collector current at low frequencies, a base-emitter capacitance 22, a base-collector (Miller) capacitance 24, and a base resistor 26 between the external base and a node 28 where the base-emitter capacitance 22 and the base-collector capacitance are connected. In this model the current through the current source 20 is proportional to the voltage between the node 28 and the emitter. The capacitors 22, 24 and the resistor 26 are intrinsic elements of the transistor, not separate components.

The intrinsic capacitances cause leakage of current from the transistors Q1–4 at high frequencies. This results in a reduction of the gain of the circuit at higher frequencies. The gain can be expressed in terms of a transfer function which expresses the ratio of the Fourier transformed value of the output signal and the Fourier transformed value of the input voltage as a function of frequency. According to the model of FIG. 2a, this transfer function corresponds to a first polynomial function of the frequency divided by a second polynomial function of the frequency. The positions of the zeros of the second polynomial correspond to the poles of the transfer function. These poles, which generally occur at complex values, are characteristic of the decrease in gain as a function of frequency: the greater their imaginary part, the slower the decrease.

FIGS. 3a–b show the positions of some of the poles of the transfer function of FIG. 2 marked with a cross X for a number of values of the first load resistor R1. The frequency is plotted on the vertical axis, so that poles at purely imaginary frequencies are on the horizontal axis. In addition, zeros of the transfer function have been plotted as circles O.

A first set of poles 30a–c corresponds to the situation where the value of the first load resistor R1 is zero ohms. These poles are caused as follows. Input current leaks through the base-emitter capacitance of the input transistor Q1 and does not contribute to amplified current. This current leak leads to a first one of the poles 30a, with a corresponding loss of gain at higher frequencies. Current also leaks from the emitter to the base of the internal transistor Q2 owing to be base emitter capacitance of Q2 and from the base of the output transistor Q4 owing to the base-emitter capacitance of Q4. This leads to further poles 30b, c as well as to a zero 31 in the transfer function.

FIG. 3b shows what happens when the value of the first load resistor R1 is increased. This causes these latter poles 30b, c to shift towards each other along the horizontal axis (still at purely imaginary frequencies). The zero 31 moves to lower frequencies as well. When the resistance of the first load resistor R1 reaches a critical value, these two migrated poles reach a position 32 where they meet each other. The critical value depends on the precise circuit parameters and can be easily determined with a computer program for a circuit analysis, or, more laboriously, by manual calculation. For a typical circuit in which the transconductance of all transistors Q1 to Q4 is 1/(70 ohms), the base-emitter capacitance is 0.32 pF, the Miller (base collector) capacitance is 0.013 pF, and the intrinsic base resistance is 27 ohms, the critical value of the first load resistor is approximately 54 ohms.

When R1 exceeds the critical value, the poles migrate into the imaginary plane via orbits 34a, b. By themselves, these poles would therefore correspond to a gain that increases initially when the frequency rises from zero (or decreases less than expected owing to a pole on the axis), and would decrease only after the frequency rises beyond the value of the real part of the pole. This compensates for the effect of the pole 30a caused by the base-emitter capacitance of the input transistor Q1. A broadband amplifier with a higher cut-off frequency is realized thereby.

At the same time, the zero 31 created by Q2 moves to lower frequencies. This reduces the amount by which the gain drops with frequency at low frequencies. For a further critical value, this displaced zero 33 is positioned exactly on top of pole 30a that originates from the base-emitter of Q1. At this value, the zero completely eliminates the effect of this pole. The further critical value depends on the precise circuit parameters and can also be easily determined with a computer program for a circuit analysis, or, more laboriously, by manual calculation. For the typical circuit mentioned hereinbefore, the further critical value is 327.9 ohms.

When the resistance value is increased further, the zero 31 will have a more profound effect on the gain than has the pole 30a caused by the input circuit. The broadband behavior of the amplifier is optimized when the component values of the amplifier are selected such that the introduced zero is positioned on top of pole 30a. This pushes the drop in gain as a function of frequency to as high as possible a value without causing a significant increase in gain for lower frequencies, which occurs at higher values of R1.

Effectively, the combination of the first load resistor R1 and the internal transistor Q2 adds a special kind of impedance to the node between the input transistor Q1 and the output transistor Q4. This impedance can also be modified by an additional resistor between the base of Q2 and ground. The voltage produced at this node in response to the current from input transistor Q1 is determinative of the transfer function. This voltage depends on the impedance provided by the combination of the first load resistor R1 and the internal transistor. This voltage can also be modified by an additional resistor between the base of Q2 and ground. The impedance of this combination shifts the poles of the transfer function into the complex plane when the resistance value of R1 is sufficiently large and it creates a zero.

FIG. 4 shows a further circuit according to the invention. This further circuit differs from the circuit of FIG. 2 in that the collector of the internal transistor Q2 is connected to the base of the further output transistor Q3. Thus, a certain fraction of the current from output transistor Q4 will reach first load resistor R1. This increases the migration speed of the poles of the transfer function, so that the critical value of the resistance is lower than for the circuit of FIG. 2. With the parameters mentioned above, the critical resistance of the circuit of FIG. 4 is 8.7 ohm and the further critical (and optimum) value for realizing a broadband amplifier is 169.5 ohm. Because of the lower critical resistance value this circuit suffers less from parasitic effects so that it can be used more easily at higher frequencies.

Additionally, the poles 30b, c therein move away from the imaginary frequency axis over a greater angle. Thus, the poles 30b, c reach approximately a 45 degree angle with the axis when the zero 33 covers the other pole 30a. An optimum broadband characteristic is realized thereby.

It should be noted that the coupling between the collector of the internal transistor Q2 and the base of the further output transistor Q3 has little or no effect on the low-frequency gain, because the current through the further output transistor Q3 is determined by the output transistor Q4. The emitter voltage of the further output transistor Q3 will simply follow the collector voltage of the internal transistor Q2 without affecting the current through the further output transistor Q3. Therefore, the internal transistor Q2 is effectively outside the path between input and output of the amplifier of both Figures. Its only essential effect is to modify the impedance at the node between the collector of the input transistor Q1 and the base of the output transistor Q4.

FIG. 5 shows a further circuit according to the invention. A differential amplifier 50 is constructed with a first and a second amplifier 51, 52 of the type shown in FIG. 2, except for the fact that the emitters of the mirror transistors 510, 520 of the amplifiers are coupled to a common current source 54. The outputs of the differential amplifier 50 may be coupled to inputs of a push-pull stage (not shown) via capacitors (not shown).

It will be appreciated that the invention is not limited to the embodiments shown in the Figures. For example, instead of using merely the intrinsic capacitances and resistors of the internal transistor Q2, one may use additional external components such as, for example, an additional base resistor or base emitter capacitance to adjust the effect. However, this is not necessary: the natural intrinsic parameters of transistor Q2 in combination with a single collector resistance already produce the required effect. Of course this collector resistance does not need to be a resistor: any resistive element, such as a network of resistors, a long, thin conductor line, or an appropriately configured transistor may be used. Also, although the invention has been illustrated with bipolar transistors, it will be understood that FETs, MOS (IGFET) transistors, or any other type of transistor may be used for any one or all of the transistors Q1 to 4. The invention still applies because all types of transistors have leakage capacitances from their control electrodes to their main channel electrodes and intrinsic control electrode resistances. If need be, these capacitances or resistances can be increased by the addition of external components.

Also, additional transistors, such as further cascode transistors, may be used instead of the single internal transistor Q2 to feed the load resistor R1, as long as there is a sufficient feedback capacitance to the control electrode of Q2. The further output transistor Q3 may be omitted or replaced by another circuit or circuit element, for example, the output of a current mirror that 'folds' the output current, or a resistor. The internal transistor Q2 may be connected to any junction point between the collector and base of successive transistors Q1, Q4 in an amplification path: it does not necessarily need to be connected directly to the transistor Q1 whose pole it helps to compensate. Nor does it need to be connected directly at a base-collector connection: it may be connected to any point in the amplification path that is fed by a current when the voltage of the point is determinative of the gain, because it is the impedance contribution of the internal transistor that leads to the migration of the poles. Preferably, however, the main current channel of a transistor is used to feed this current. Additional internal transistors may be used at different points in the circuit to provide additional compensation.

The invention claimed is:

1. An amplifier circuit comprising:
   an input (In) and an output (Out) and an internal node (10);
   an input transistor (Q1) with a first control electrode coupled to the input (In) and a first main current channel coupled to the internal node (10);
   an output transistor (Q4) with a second control electrode coupled to the internal node (10) and a second main current channel coupled to the output (Out);
   an internal transistor (Q2) with a third main current channel coupled to the internal node (10),
   characterized in that a main low-frequency current path from the first main channel (Q1) to the second control electrode (Q4) does not pass through the third main current channel (Q2); the amplifier circuit comprising:
   a resistive element (R1), the internal node (10) being coupled to a power supply connection via the third main current channel (Q2) and the resistive element (R1) in that order, wherein a resistance value of the resistive element (R1) exceeds a critical value above which poles (34b, c) of a transfer function of the amplifier circuit develop a real frequency component in order to raise amplifier cut-off frequency and optimize broadband gain.

2. An amplifier circuit as claimed in claim 1, wherein the resistance value has been selected such that a zero (33) of the transfer function has a frequency position lower than or equal to a frequency position of a pole (30a) in the transfer function which is caused by a combination of the first transistor (Q1) and a circuit upstream of preceding the first control electrode.

3. An amplifier circuit as claimed in claim 1, comprising a further output transistor (Q3) with a fourth main current channel in series with the second main current channel (Q4) and a fourth control electrode coupled to a further node between the third main current channel (Q2) and the resistive element (R1).

4. An amplifier circuit as claimed in claim 1, comprising a differential amplifier with a current source (54) and first and second identical branches (51, 52), the first branch (51) comprising the input transistor (Q1), the internal transistor (Q2), and the output transistor (Q4) and the second branch comprising a further input transistor, a further internal transistor, and a further output transistor, while the main current channels of the output transistors are coupled in parallel to the current source.

5. An amplifier circuit as claimed in claim 1, wherein the resistance value is selected such that a zero (33) of the transfer function of the amplifier whose position depends on the resistance value substantially coincides with a pole (30a) caused by a circuit at the control electrode of the input transistor.

* * * * *